United States Patent
Kao et al.

(10) Patent No.: US 9,837,307 B2
(45) Date of Patent: Dec. 5, 2017

(54) SEMICONDUCTOR DEVICE AND PROCESS

(71) Applicant: Taiwan Semiconductor Manufacturing Company, Ltd., Hsin-Chu (TW)

(72) Inventors: Hsiang-Lun Kao, Taoyuan (TW); Tien-Lu Lin, Hsin-Chu (TW); Yung-Chih Wang, Taoyuan (TW); Yu-Chieh Liao, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/425,804

(22) Filed: Feb. 6, 2017

(65) Prior Publication Data

US 2017/0148671 A1   May 25, 2017

Related U.S. Application Data

(62) Division of application No. 14/498,529, filed on Sep. 26, 2014, now Pat. No. 9,564,396.

(51) Int. Cl.
    *H01L 21/768*     (2006.01)

(52) U.S. Cl.
    CPC .... *H01L 21/76847* (2013.01); *H01L 21/7682* (2013.01); *H01L 21/76819* (2013.01); *H01L 21/76829* (2013.01)

(58) Field of Classification Search
    None
    See application file for complete search history.

(56) References Cited

U.S. PATENT DOCUMENTS

| | | | |
|---|---|---|---|
| 6,200,900 B1 | 3/2001 | Kitch | |
| 6,281,585 B1 | 8/2001 | Bothra | |
| 7,501,347 B2 | 3/2009 | Noguchi et al. | |
| 2003/0183940 A1 | 10/2003 | Noguchi et al. | |
| 2015/0235955 A1* | 8/2015 | Kudo | H01L 23/53238 257/751 |

FOREIGN PATENT DOCUMENTS

JP   WO 2014069662 A1 *  5/2014  ......... H01L 23/5226

* cited by examiner

*Primary Examiner* — Lex Malsawma
(74) *Attorney, Agent, or Firm* — Slater Matsil, LLP

(57) ABSTRACT

A metal first, via first process for forming interconnects within a metallization layer of a semiconductor device is provided. In an embodiment a conductive material is deposited and the conductive material is patterned into a conductive line and a via. A dielectric material is deposited over the conductive line and the via, and the dielectric material and the via are planarized.

20 Claims, 8 Drawing Sheets

SEMICONDUCTOR DEVICE AND PROCESS

PRIORITY CLAIM

This application is a division of and claims the benefit of U.S. application Ser. No. 14/498,529, filed on Sep. 26, 2014 and entitled "Semiconductor Device and Process," which application is incorporated herein by reference.

BACKGROUND

The semiconductor industry has experienced rapid growth due to continuous improvements in the integration density of a variety of electronic components such as transistors, diodes, resistors, capacitors, and the like onto a semiconductor substrate. For the most part, these improvements in integration density have come from repeated reductions in minimum feature sizes, which allow more components to be integrated into a given area of the semiconductor substrate.

However, as the demand for miniaturization, higher speeds, and greater bandwidths, as well as lower power consumption and latency, has grown, there has also grown a need for smaller and smaller interconnections. In particular, as the size of the transistors, diodes, resistors, capacitors, etc. have been reduced, the interconnections that electrically route signals, power and ground to and from these electronic components has also experienced a reduction in size. As such, techniques to reduce these interconnections are constantly being sought for further miniaturization.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
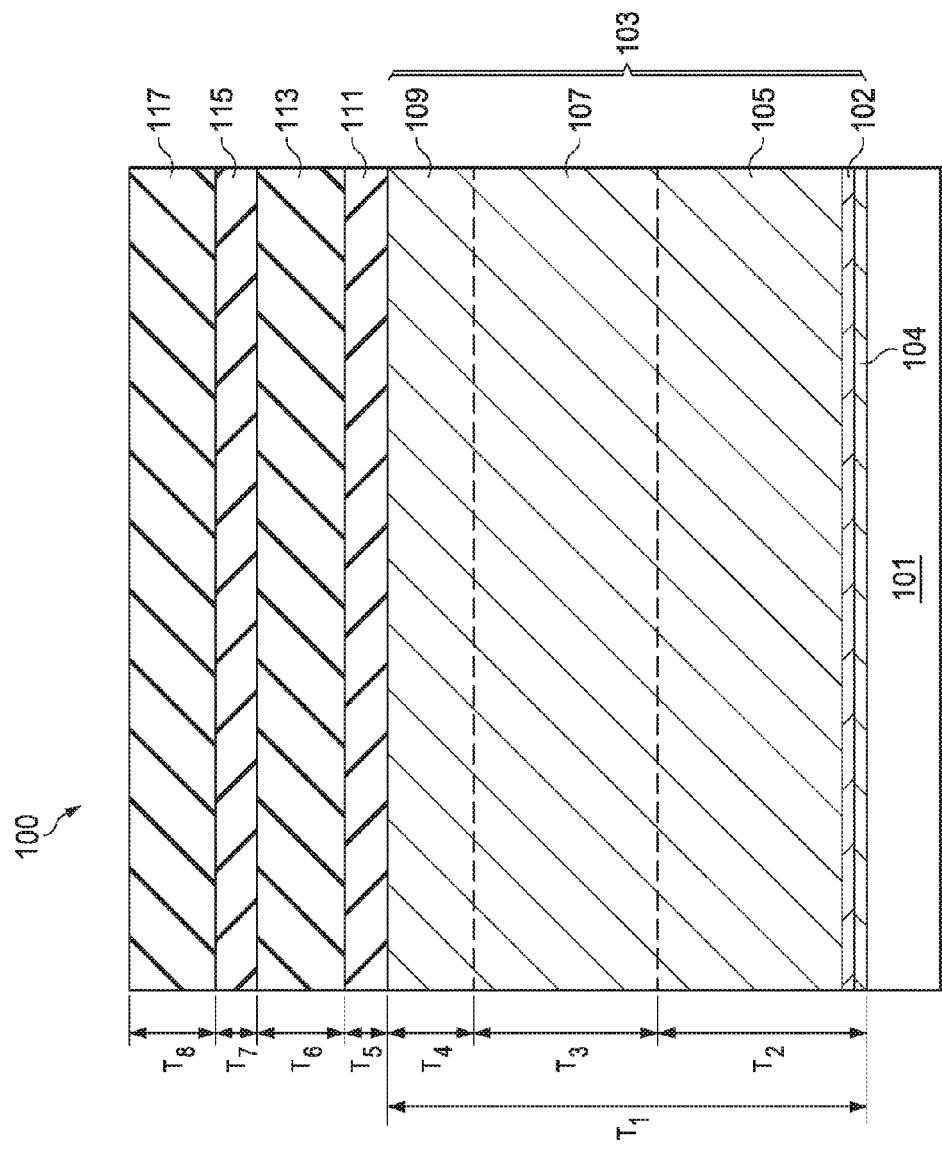
FIG. 1 illustrates a conductive material, a first hard mask, a second hard mask, a third hard mask, and a fourth hard mask in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is illustrated a conductor first, self-aligned via first process for forming interconnects within a semiconductor device 100. In an initial step a layer of conductive material 103 is formed over a substrate 101. In an embodiment the substrate 101 may comprise a semiconductor substrate (not individually illustrated in FIG. 1), active devices (also not individually illustrated in FIG. 1) on or within the semiconductor substrate, and, optionally, one or more metallization layers (also not individually illustrated in FIG. 1) over the active devices. The semiconductor substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices may be formed on the semiconductor substrate. As one of ordinary skill in the art will recognize, a wide variety of active devices such as capacitors, resistors, inductors and the like may be used to generate the desired structural and functional requirements of the design for the semiconductor device 100. The active devices may be formed using any suitable methods either within or else on the surface of the semiconductor substrate.

The one or more metallization layers are formed over the semiconductor substrate and the active devices and are designed to connect the various active devices to form functional circuitry. In an embodiment the metallization layers may be formed of alternating layers of dielectric (e.g., low-k dielectric material) and conductive material (e.g., copper) and may be formed through any suitable process (such as by the process described herein, a deposition process, a damascene process, a dual damascene process, etc.). In an embodiment there may be four layers of metallization separated from the semiconductor substrate by at least one interlayer dielectric layer (ILD), but the precise number of metallization layers is dependent upon the design of the semiconductor device 100.

To protect the substrate 101 from any out diffusion of the conductive material 103, a barrier layer 104 may be formed over the substrate 101. In an embodiment the barrier layer 104 is a material such as titanium, titanium nitride, tantalum, tantalum nitride, or the like formed using a process such as chemical vapor deposition, plasma enhanced chemical vapor deposition, atomic layer deposition, or the like. The barrier layer 104 may be deposited to a thickness of about 50 Å to about 500 Å.

The conductive material 103 is formed over the substrate 101 and the barrier layer 104 by initially forming a first seed layer 102 on the barrier layer 104. In an embodiment the first seed layer 102 is utilized as a nucleation layer for a subsequent material to be deposited on and, as such, may be copper or a copper alloy (e.g., a titanium copper alloy) formed through a suitable formation process such as chemical vapor deposition or sputtering. The first seed layer 102 may be formed to a thickness of between about 5 Å and about 100 Å.

Once the seed layer 102 has been formed, the remainder of the conductive material 103 may be formed by depositing the remainder of the conductive material 103 onto the first seed layer 102. In an embodiment the remainder of the conductive material 103 is a same material as the seed layer, such as copper, although it may be a different material or have a different composition than the materials of the first seed layer 102. The remainder of the conductive material 103 may be deposited using a deposition process such as electroplating or electroless plating, although any suitable deposition process may alternatively be utilized.

In an embodiment the conductive material 103 may be formed to have an overall first thickness $T_1$ that is suitable for the remainder of the manufacturing process. Within this overall first thickness $T_1$, the conductive material 103 may have multiple sub-regions that will be formed into different structures. For example, the conductive material may have a first region 105 with a second thickness $T_2$ that is suitable for forming conductive lines 401 (not illustrated in FIG. 1 but illustrated and discussed below with respect to FIG. 4), a second region 107 with a third thickness $T_3$ that is suitable for forming a via 701 (not illustrated in FIG. 1 but illustrated and discussed below with respect to FIG. 7), and a third region 109 with a fourth thickness $T_4$ that is used as sacrificial material for a planarization process (not illustrated in FIG. 1 but illustrated and described below with respect to FIG. 7). In an embodiment the first thickness $T_1$ may be between about 600 Å and about 10000 Å, such as about 600 Å, the second thickness $T_2$ may be between about 200 Å and about 5000 Å, such as about 200 Å, the third thickness $T_3$ may be between about 200 Å and about 5000 Å, such as about 200 Å, and the fourth thickness $T_4$ may be between about 100 Å and about 2000 Å, such as about 100 Å.

However, as one of ordinary skill in the art will recognize, the materials, processes, and dimensions described herein are only intended to be illustrative and are not intended to be limiting upon the embodiments. Rather, any other suitable materials (such as tungsten), any other suitable methods of formation (such as chemical vapor deposition, physical vapor deposition, atomic layer deposition, etc.) and any other suitable thicknesses, may alternatively be used. All such variations are fully intended to be included within the scope of the embodiments.

Once the conductive material 103 has been formed, a first hard mask 111, a second hard mask 113, a third hard mask 115, and a fourth hard mask 117 are formed over the conductive material 103. In an embodiment the first hard mask 111 and the second hard mask 113 will be used as masks to form the conductive lines 401 (not illustrated in FIG. 1 but illustrated and discussed below with respect to FIG. 4). Additionally, the third hard mask 115 and the fourth hard mask 117 will be used as masks to form the vias 701 (again not illustrated in FIG. 1 but illustrated and described below with respect to FIG. 7).

In an embodiment the first hard mask 111 comprises a dielectric material such as silicon nitride, titanium nitride, silicon oxynitride, combinations of these, or the like. The first hard mask 111 may be formed using a process such as chemical vapor deposition, plasma enhanced chemical vapor deposition, atomic layer deposition, or the like. However, any other suitable material and method of formation may alternatively be utilized. The first hard mask 111 may be formed to a fifth thickness $T_5$ of between about 20 Å and about 3000 Å, such as about 20 Å.

The second hard mask 113 is formed over the first hard mask 111. In an embodiment the second hard mask 113 is formed in order to gain additional selectivity to the conductive material 103, to help constrain the dimensions of the subsequently formed via 701, and to avoid critical dimension mismatch in multi-patterning technology. In an embodiment the second hard mask 113 is formed using a different material with a different etch selectivity than the first hard mask 111, and may be a material such as titanium nitride, or tantalum nitride, other nitrides or carbides, combinations of these, or the like, and may be formed using a deposition process such as chemical vapor deposition, plasma-enhanced chemical vapor deposition, sputtering, evaporation, atomic layer deposition, combinations of these, or the like. The second hard mask 113 may be formed to a sixth thickness $T_6$ of between about 20 Å and about 3000 Å, such as about 20 Å.

The third hard mask 115 is formed over the second hard mask 113. In an embodiment the third hard mask 115 may be similar to the first hard mask 111. For example, the third hard mask 115 may be silicon nitride formed using a chemical vapor deposition process, although any suitable process may alternatively be utilized. The third hard mask 115 may be formed to a seventh thickness $T_7$ of between about 20 Å and about 3000 Å, such as about 20 Å.

The fourth hard mask 117 is formed over the third hard mask 115. In an embodiment the fourth hard mask 117 may be similar to the second hard mask 113, such as by being titanium nitride formed using chemical vapor deposition, although any suitable material and process of formation may alternatively be utilized. The fourth hard mask 117 may be formed to an eighth thickness $T_8$ of between about 20 Å and about 3000 Å, such as about 20 Å.

Figure 2:
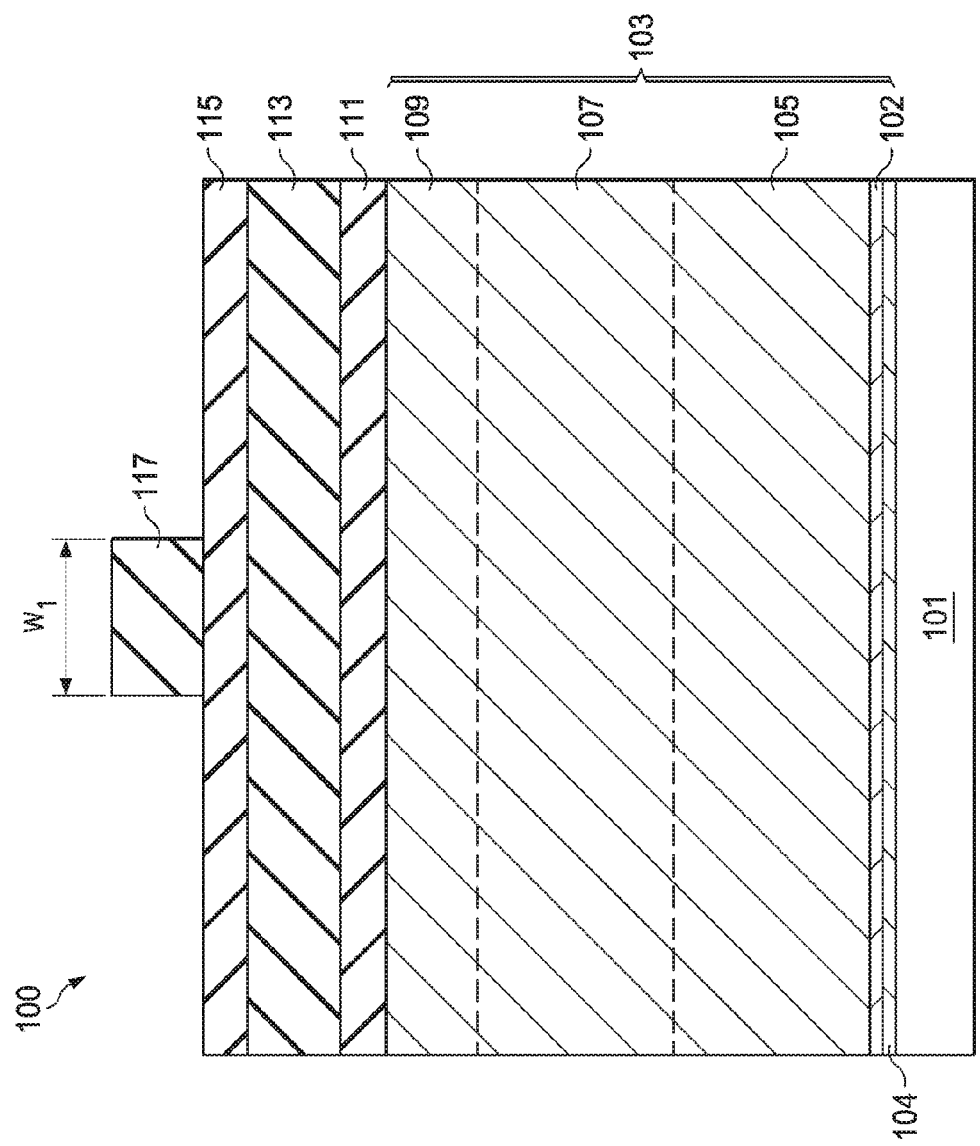
FIG. 2 illustrates a patterning of the fourth hard mask in accordance with some embodiments.

FIG. 2 illustrates a patterning of the fourth hard mask 117. In an embodiment the fourth hard mask 117 may be patterned by initially placing a first photoresist (not individually illustrated) over the fourth hard mask 117 and exposing the first photoresist to a patterned energy source (e.g. light) in order to initiate a chemical reaction that modifies the physical properties of the exposed portions of the fourth hard mask 117. The first photoresist may then be developed by applying a first developer (also not individually illustrated in FIG. 2) in order to utilize the modified physical properties between the exposed region and the unexposed region to selectively remove either the exposed region or the unexposed region.

Once the first photoresist has been patterned, the first photoresist may be used as a mask in order to pattern the underlying fourth hard mask 117. In an embodiment the fourth hard mask 117 may be patterned using, e.g., a reactive ion etching process with the first photoresist as a mask. The patterning process may be continued until the third hard mask 115 is exposed beneath the fourth hard mask 117.

Once the fourth hard mask 117 has been patterned, the first photoresist may be removed from the fourth hard mask 117. In an embodiment the first photoresist may be removed utilizing, e.g., an ashing process, whereby a temperature of the first photoresist is raised until the first photoresist experiences a thermal decomposition and may be easily removed using one or more cleaning process. However, any other suitable removal process may alternatively be utilized.

In an embodiment the fourth hard mask 117 is patterned in order to, eventually, pattern the conductive material 103 into a shape of the via 701 (not illustrated in FIG. 2 but illustrated and described below with respect to FIG. 7). As such, in an embodiment the fourth hard mask 117 is patterned to have a similar pattern as the desired shape of the via 701. For example, the fourth hard mask 117 may be patterned to have a first width $W_1$ of between about 10 nm and about 500 nm, such as about 10 nm, that will be translated to the via 701.

Figure 3:
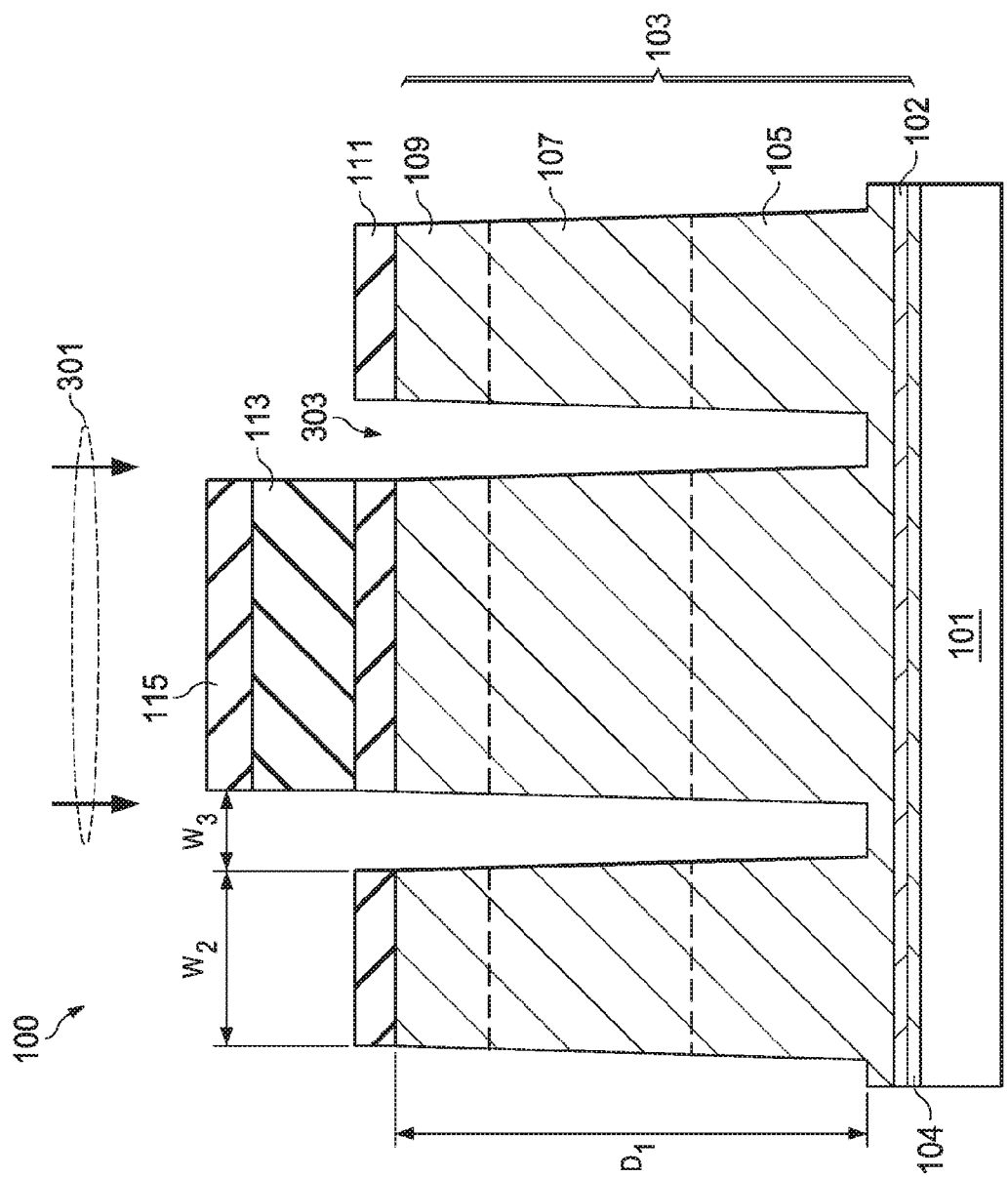
FIG. 3 illustrates a partial patterning of the conductive material in accordance with some embodiments.

FIG. 3 illustrates a patterning of the third hard mask 115, the second hard mask 113, and the first hard mask 111. In an embodiment the third hard mask 115 is patterned using, e.g., a dry etch process such as a reactive ion etch using the fourth hard mask 117 (see FIG. 2) as a masking layer. As such, the regions of the third hard mask 115 that are covered by the fourth hard mask 117 are protected while exposed regions of the third hard mask 115 that are not covered by the fourth hard mask 117 are removed. However, any suitable removal process may alternatively be utilized.

Once the third hard mask 117 has been patterned, the second hard mask 113 is patterned. In an embodiment the second hard mask 113 may be patterned using a second photoresist (not illustrated in FIG. 3). The second photoresist may be placed, exposed, and developed similar to the first photoresist (described above with respect to FIG. 2), although the second photoresist may alternatively be different from the first photoresist.

Once the second photoresist has been patterned, the pattern of the second photoresist may be transferred to the second hard mask 113 using, e.g., a dry etch process such as a reactive ion etch using the second photoresist as a masking layer. As such, the regions of the second hard mask 113 that are covered by the second photoresist are protected while exposed regions of the second hard mask 113 that are not covered by the second photoresist are removed. However, any suitable removal process may alternatively be utilized. Once the second hard mask 113 has been patterned, the second photoresist may be removed using, e.g., an ashing process.

Once the second hard mask 113 has been patterned, the pattern of the second hard mask 113 is transferred to the first hard mask 111. In an embodiment the first hard mask 111 is patterned using, e.g., a dry etch process such as a reactive ion etch using the second hard mask 113 as a masking layer. As such, the regions of the first hard mask 111 that are covered by the second hard mask 113 are protected while exposed regions of the first hard mask 111 that are not covered by the second hard mask 113 are removed. However, any suitable removal process may alternatively be utilized.

In an embodiment the first hard mask 111 is patterned to form conductive lines 401 (not illustrated in FIG. 3 but illustrated and described below with respect to FIG. 4) from the conductive material 103. As such, in an embodiment the first hard mask 111 may be patterned to have a second width $W_2$ of between about 10 nm and about 500 nm, such as about 10 nm. However, any suitable dimensions may alternatively be utilized.

FIG. 3 also illustrates an initial partial etch (represented in FIG. 3 by the arrows labeled 301) of the conductive material 103. In an embodiment the partial etch is utilize to form first openings 303 within the conductive material 103 using, e.g., the first hard mask 111, the second hard mask 113, the third hard mask 115, and the fourth hard mask 117 as masks. In an embodiment the partial etch 301 may be a dry etch such as a reactive ion etch that utilizes etchants to remove exposed portions of the conductive material 103 without significantly removing unexposed portions of the conductive material 103.

In an embodiment the etchants may be etchants that are selective to the conductive material 103. For example, in an embodiment in which the conductive material 103 is copper, the etchants may be $Cl_2$, $CF_4$, or $CH_4$. However, any suitable etchants may be used to remove the exposed portions of the conductive material 103, and all such etchants are fully intended to be included within the scope of the embodiments. The etchants may be introduced at a flow rate of between about 20 sccm and about 100 sccm at a temperature of between about 10° C. and about 130° C.

The first openings 303 may be formed into the conductive material 103. In an embodiment the first openings 303 may be formed to a first depth $D_1$ from an upper surface of the conductive material 103 of between about 300 Å and about 5000 Å, such as about 300 Å. However, the first openings 303 may be formed to any suitable depth. Additionally, the first openings 303 may be formed to have a third width $W_3$ of between about 10 nm and about 500 nm, such as about 10 nm.

FIG. 3 also illustrates that, in an embodiment, exposed portions of the second hard mask 113 and the remaining portions of the fourth hard mask 117 (see FIG. 2) may also be removed. Such a removal leaves the first hard mask 111 over those portions of the conductive material 103 that will be formed into the conductive lines 401 along with a stack of masks (e.g., the first hard mask 111, the second hard mask 113, and the third hard mask 115) over portions of the conductive material 103 that will be formed into the vias 701. This removal of the second hard mask 113 and the fourth hard mask 117 may be performed either during the partial etch 301 (in an embodiment in which the etchants used during the partial etch 301 will also suitably remove the second hard mask 113 and the fourth hard mask 117) or else in a separate etch process (in an embodiment in which the etchants used during the partial etch 301 will not suitable remove the second hard mask 113 and the fourth hard mask 117).

Figure 4:
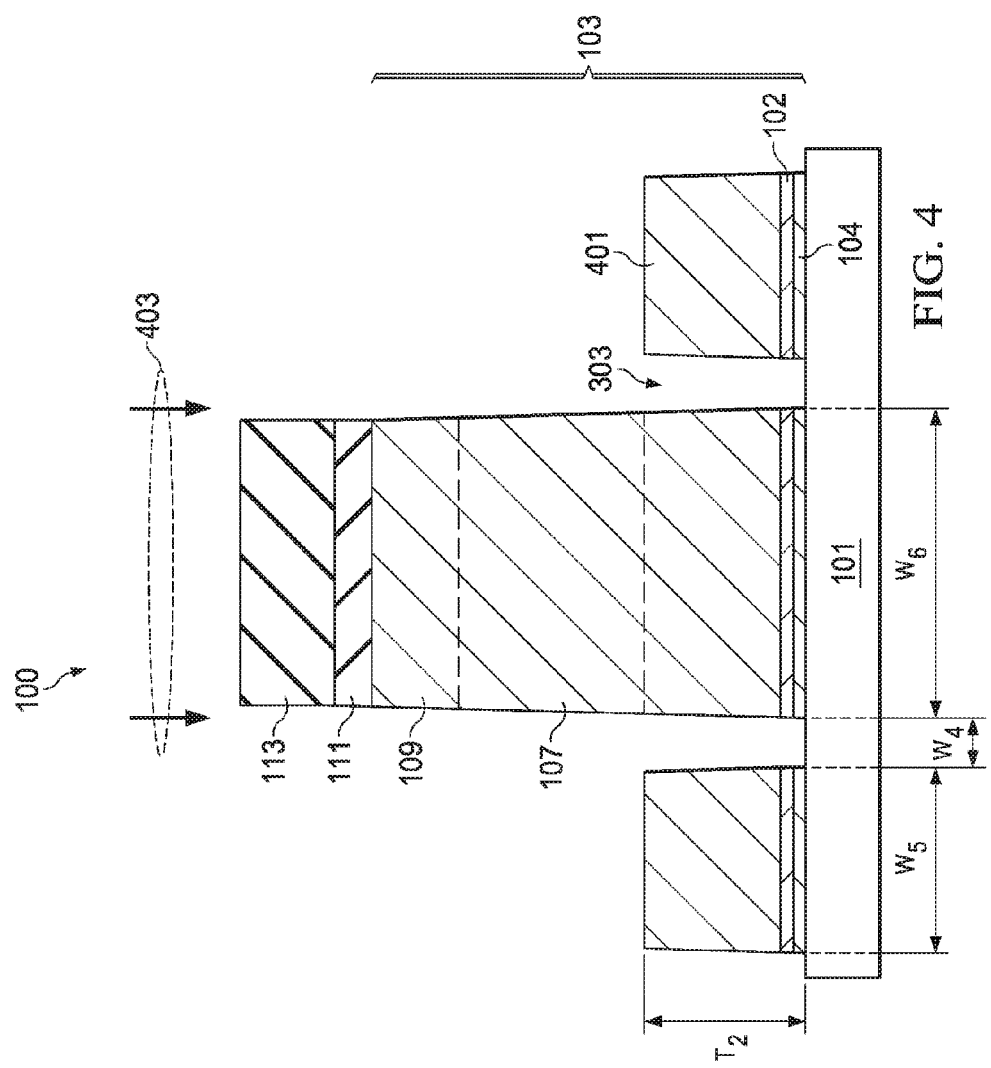
FIG. 4 illustrates a formation of conductive lines in accordance with some embodiments.

FIG. 4 illustrates another series of etches utilized to shape portions of the conductive material 103 into conductive lines 401 that may be used to route electrical signals, power, or ground connections around the semiconductor device 100. In an embodiment the formation of the conductive lines 401 may be initiated by removing the first hard mask 111 (see FIG. 3) from over those portions of the conductive material 103 which will be used to form the conductive lines 401. For example, a dry etch such as a reactive ion etch may be utilized to remove the first hard mask 111 (e.g., silicon nitride) from over those portions of the conductive material 103 that will be formed into the conductive lines 401.

Additionally, in an embodiment in which the first hard mask 111 is a similar material as the third hard mask 115, this initial etch process may also remove any remaining portions of the third hard mask 115, such as those portions that remain over the second hard mask 113 (e.g., over the portions of the conductive material 103 that will be formed into the via 701). Alternatively, in embodiments in which the third hard mask 115 is a different material than the first hard mask 111, the third hard mask 115 may be removed using a separate removal process.

However, while the exposed portions of the first hard mask 111 are removed to expose the underlying conductive material 103, those portions of the first hard mask 111 that are still covered by the second hard mask 113 (e.g., over those portions that are intended to be shaped into the via 701), will not be removed during this process. As such, the covered portions of the first hard mask 111 will still be available during subsequent processes as a mask.

Once the exposed portions of the first hard mask 111 have been removed, the newly exposed portions of the conductive material 103 may be shaped using a shaping etch (represented in FIG. 4 by the arrows labeled 403). In an embodiment the shaping etch 403 is performed in order to extend the first openings 303 through the conductive material 103 to separate one portion of the conductive material 103 from other portions of the conductive material 103 (e.g., to separate the conductive lines 401 from the vias 701). The shaping etch 403 may be performed using, e.g., a dry etch such as a reactive ion etch with a plasma source and an etchant such as an etching gas with a carbon, fluorine or argon base, hydrogen ($H_2$), ammonia ($NH_3$), argon (Ar), helium (He), combinations of these, or the like, using the remaining portions of the first hard mask 111 and the second hard mask 113 as masks. The RF power may be between about 40 W to about 500 W and the bias power may be between about 50 W and about 500 W.

Additionally, the shaping etch 403 will also reduce the height of the conductive material 103 where the conductive material 103 is exposed. In an embodiment the overall thickness $T_1$ of the conductive material 103, in forming the conductive lines 401, may be reduced to the second thickness $T_2$ in those regions formed into the conductive lines 401. The first openings 303, after being extended during the shaping etch 403, may have a fourth width $W_4$ that is sufficient to assist in the formation of air gaps 505 (not illustrated in FIG. 4 but illustrated and described below with respect to FIG. 5) of between about 10 nm and about 500 nm, such as about 10 nm.

This shaping etch 403, in addition to extending the first openings 303, will also shape the conductive lines 401 and the eventual vias 701. In an embodiment the conductive lines 401 and the vias 701 will have a base (nearest to the substrate 101) with a larger width than a top (located furthest away from the substrate 101). For example, in an embodiment in which the top of the conductive line 401 has the second width $W_2$ (from the first hard mask 111; see FIG. 3), the conductive lines 401 may have a fifth width W5 at the base of between about 10 nm and about 500 nm, such as about 10 nm. Similarly, the via 701 may have a sixth width $W_6$ at a base of the via 701 of between about 10 nm and about 500 nm, such as about 10 nm that is larger than seventh width $W_7$ a top of the via 701 (not separately illustrated in FIG. 4 but illustrated and described below with respect to FIG. 7).

Figure 5:
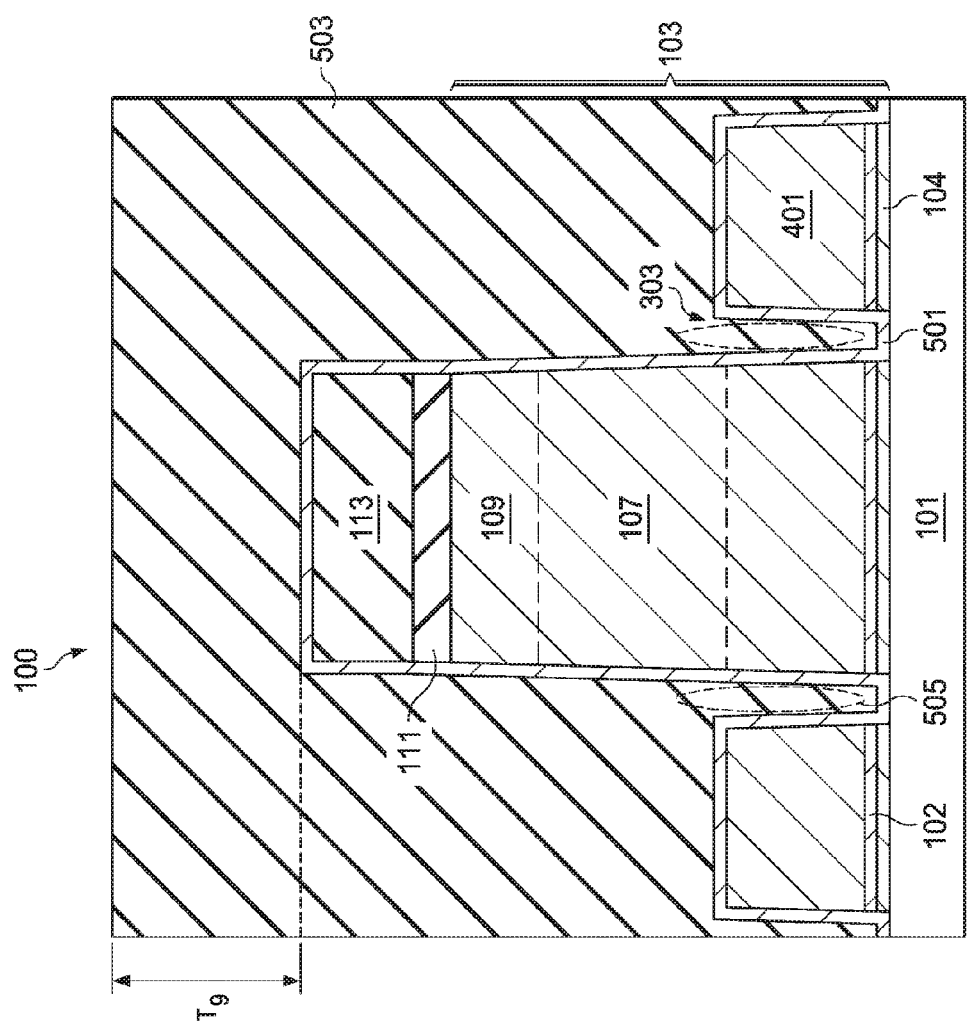
FIG. 5 illustrates a deposition of a dielectric over the conductive lines in accordance with some embodiments.

FIG. 5 illustrates a placement of a liner 501 and a first dielectric layer 503 over the conductive material 103, including the conductive lines 401, into the first openings 303, and over the remaining portions of the first hard mask 111 and the second hard mask 113. In an embodiment the liner 501 is a barrier layer that prevents diffusion of the conductive material 103 (e.g., copper) into the first dielectric layer 503, and which is in physical contact with the conductive lines 401, the via 701, and the substrate 101. The liner 501 may be formed of one or more layers of titanium, titanium nitride, tantalum, tantalum nitride, or the like. The liner 501 may be formed through chemical vapor deposition, although other techniques could alternatively be used. The liner 501 may be formed to a combined thickness of about 50 Å to about 500 Å.

Once the liner 501 has been formed, the conductive material 103 and the liner 501 may be covered by the first dielectric layer 503 in order to electrically isolate the conductive lines 401 from the remainder of the conductive material 103 (which, in an embodiment will be used to form the via 701). In an embodiment the first dielectric layer 503 is made of one or more suitable dielectric materials such as silicon oxide, silicon nitride, low-k dielectric such as carbon doped oxides, combinations of these, or the like. In a particular embodiment the first dielectric layer 503 is a single material that extends throughout the first dielectric layer 503. The first dielectric layer 503 may be formed to have a ninth thickness $T_9$ over the liner 501 over the second hard mask 113 of between about 100 Å and about 5000 Å, such as about 100 Å.

In an embodiment the first dielectric layer 503 is formed through a process such as chemical vapor deposition (CVD). In an embodiment in which the first dielectric layer is a low-K material, the chemical vapor deposition process may be controlled in order to form air gaps 505 within the first openings 303 as the first dielectric layer 503 is being deposited. For example, the chemical vapor deposition process may be performed at a temperature of between about 100° C. and about 500° C., such as about 400° C., and at a pressure of between about 1 torr and about 20 torr, such as about 10 torr. Additionally, a first precursor material, such as a porogen, is flowed in the deposition chamber at a flow rate of between about 0.5 sccm and about 10 sccm.

By controlling the parameters of the deposition process, the air gaps 505 may be formed in the first openings 303 between the conductive lines 401 and those portions of the conductive material 103 that will be formed into the vias 701. These air gaps 505, with a dielectric constant of less than 1.5, also provide additional isolation between the conductive lines 401 and the vias 701 once the vias 701 have been formed. These air gaps 505 can be formed naturally and without an extra masking step.

Figure 6:
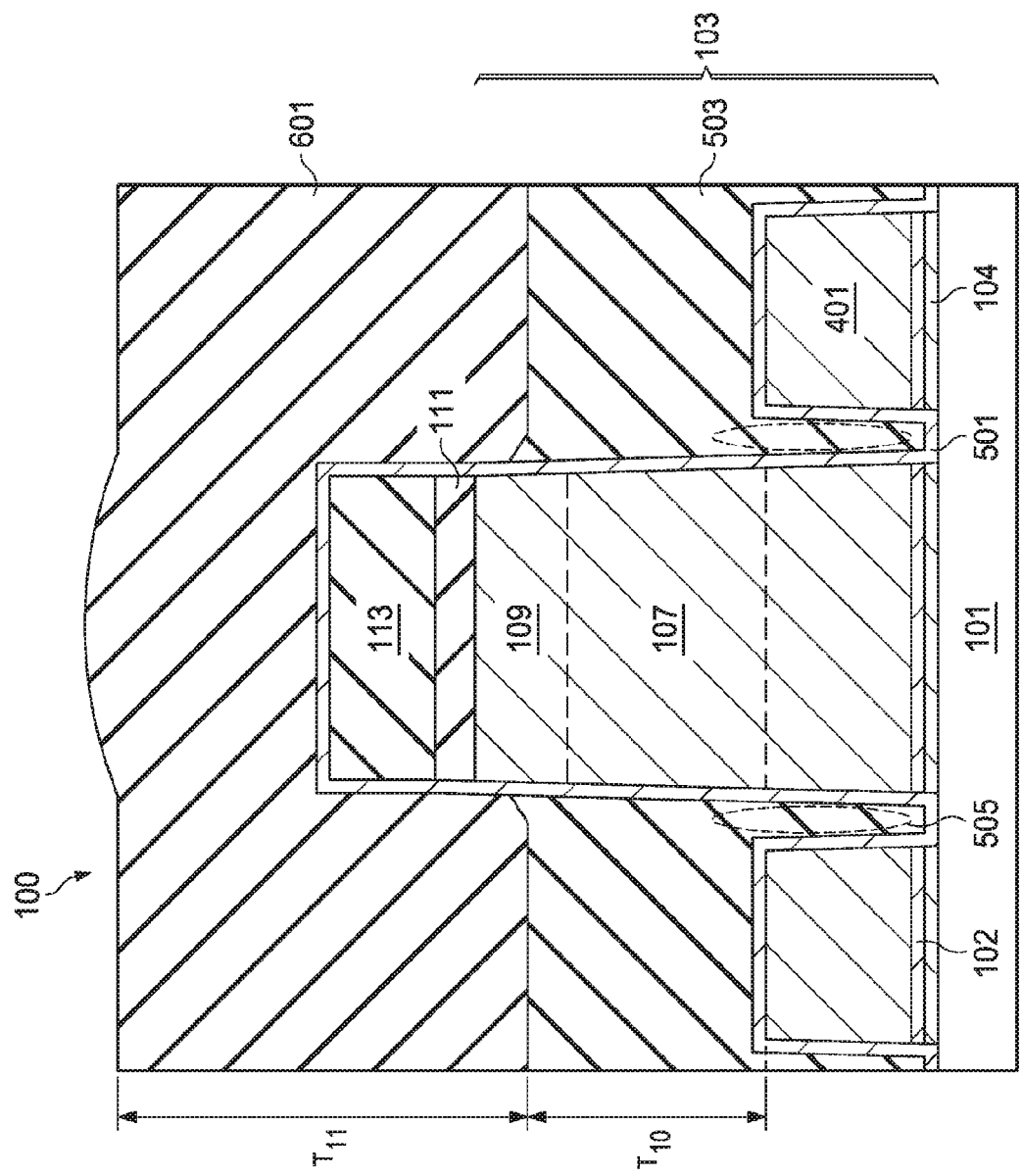
FIG. 6 illustrates an etch back of the dielectric and a deposition of an etch stop material in accordance with some embodiments.

FIG. 6 illustrates an etch back of the first dielectric layer 503 and a placement of a etch stop layer 601 over the first dielectric layer 503. In an embodiment the first dielectric layer 503 may be etched back using, e.g., a wet etch process that selectively removes the material of the first dielectric layer 503 without significantly removing the liner 501. In an embodiment the etch back is performed until the first dielectric layer 503 has a tenth thickness $T_{10}$ over the conductive lines 401 that is smaller than the desired thickness of the via 701 (discussed further below with respect to FIG. 7), such as by being between about 100 Å and about 5000 Å, such as about 400 Å.

Once the first dielectric layer 503 has been etched back, the etch stop layer 601 may be deposited over the first dielectric layer 503 and the liner 501. In an embodiment the etch stop layer 601 may be used to protect the first dielectric layer 503 from damage caused by further processing and provide for a control point for further etching processes (e.g., from the manufacture of an overlying layer). In one embodiment, the etch stop layer 601 may be formed of silicon nitride using plasma enhanced chemical vapor deposition (PECVD), although other materials such as nitride, oxynitride, carbide, boride, combinations thereof, or the like, and alternative techniques of forming the etch stop layer 601, such as low pressure CVD (LPCVD), PVD, or the like, could alternatively be used. The etch stop layer 601 may be formed to an eleventh thickness $T_{11}$ over the first dielectric layer 503 to cover the second hard mask 113, such as by being between about 500 Å and about 5000 Å, such as about 700 Å.

Figure 7:
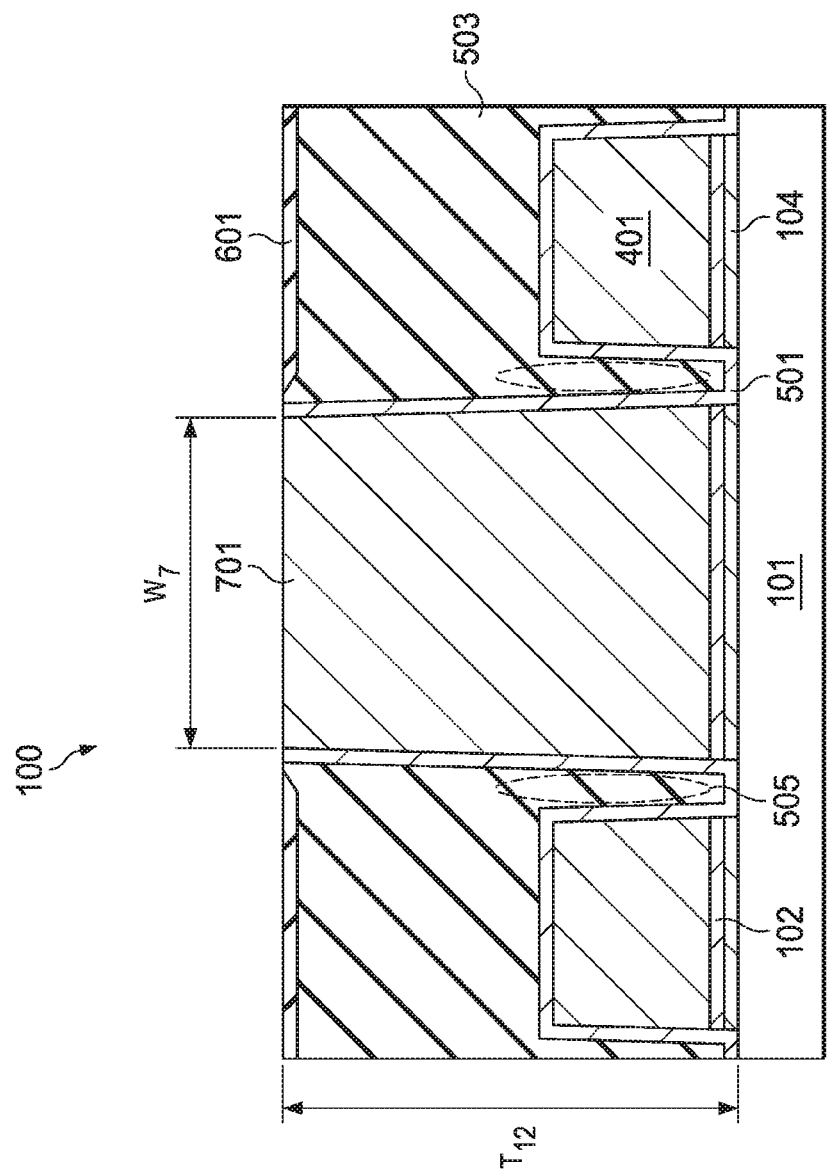
FIG. 7 illustrates a planarization of the etch stop material and the conductive material in accordance with some embodiments.

FIG. 7 illustrates a planarization process to remove the first hard mask 111, the second hard mask 113, portions of the conductive material 103, and portions of the etch stop layer 601 to form the via 701. In an embodiment the planarization process is one or more chemical mechanical polishing processes, in which etchants and abrasive are applied to the semiconductor device 100 and the semiconductor device 100 is ground with a platen in order to planarize and remove the first hard mask 111, the second hard mask 113, the conductive material 103, and the etch stop layer 601.

However, as one of ordinary skill in the art will recognize, the chemical mechanical polishing process described above is intended to be illustrative and is not intended to be limiting upon the embodiments. Rather, any suitable planarization process, such as a physical grinding process or a series of one or more etches, may alternatively be utilized. All such processes are fully intended to be included within the scope of the embodiments.

In an embodiment the planarization process is used to remove the conductive material 103 to form the via 701. The via 701 is used to route signals between the various metallization layers, such as by providing an electrical connection between the substrate 101 and an overlying second metallization layer 801 (not illustrated in FIG. 7 but illustrated and discussed below with respect to FIG. 8). Alternatively, the via 701 may provide an electrical connection between one of the conductive lines 401 (Which connection is not separately illustrated in FIG. 7) and the overlying second metallization layer 801. The via 701 may be formed with a twelfth thickness $T_{12}$ that is the sum of the second thickness $T_2$ and the third thickness $T_3$ (see, e.g., FIG. 1), and the seventh width $W_7$ of between about 10 nm and about 500 nm, such as about 10 nm.

By using the above embodiments, the overall resistance of the vias 701 and conductive lines 401 may be reduced. In particular, by avoiding the traditional dual damascene approach, the reduction in grain size within a conductive material such as copper that occurs with a decrease in the scaling of the process will cause a scattering of electrons and a subsequent increase in resistance. Additionally, using smaller and smaller vias and trenches in a dual damascene process could cause small pits or gaps during electrochemical plating (ECP) and degrade reliability performance.

However, by avoiding the dual damascene process and using the via first process as discussed herein, the grain size of the conductive material 103 can remain larger, thereby reducing the resistance and improving electromigration. Additionally, by forming the conductive material prior to patterning, the gap-filling issues normally associated with filling vias and trenches may be reduced or eliminated.

Figure 8:
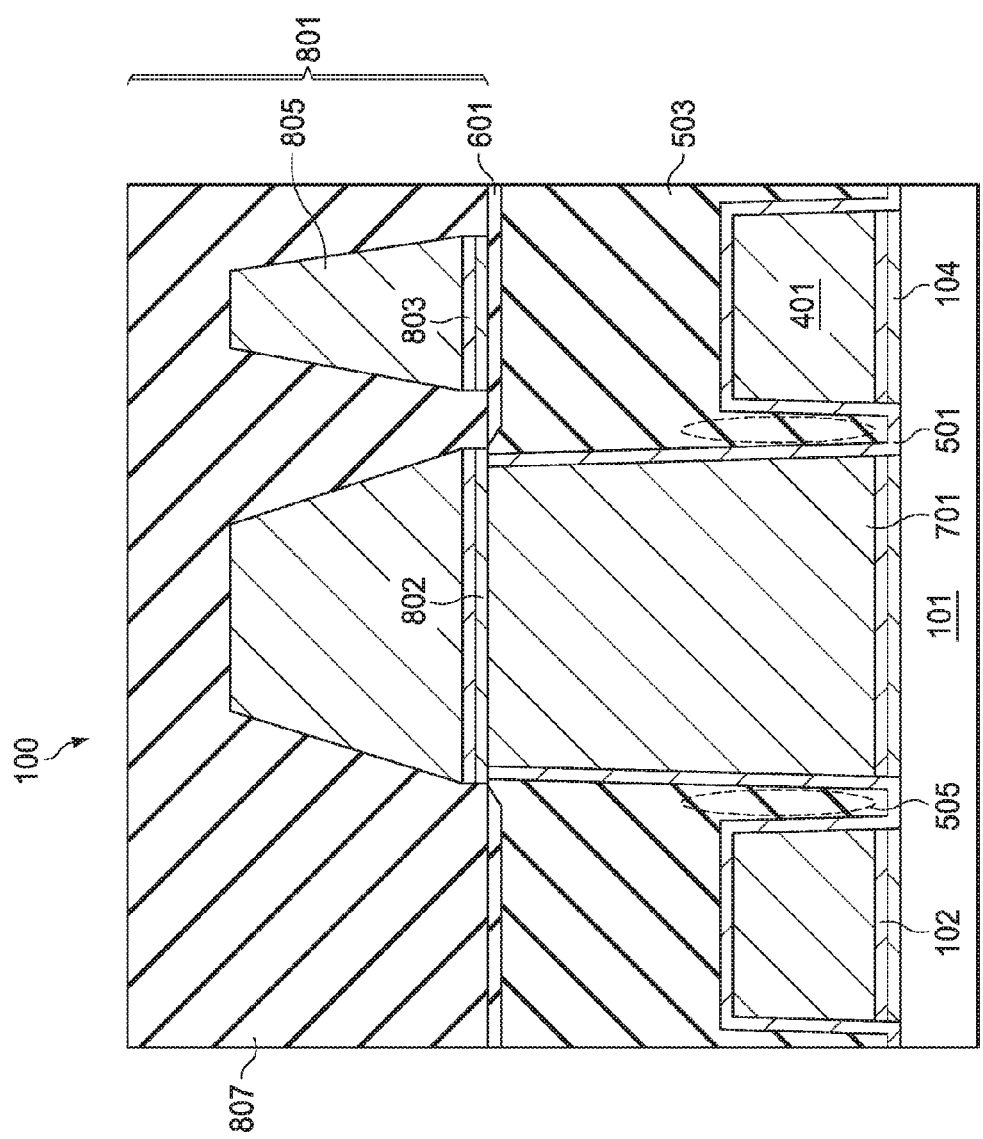
FIG. 8 illustrates a formation of an additional metallization layer in accordance with some embodiments.

FIG. 8 illustrates a formation of a second metallization layer 801 over and in electrical contact with the via 701. In an embodiment the second metallization layer 801 may comprise a second barrier layer 802, a second seed layer 803, second conductive lines 805, and a second dielectric layer 807. In an embodiment the second barrier layer 802, the second seed layer 803, the second conductive lines 805, and the second dielectric layer 807 may be made from similar materials and using similar processes (e.g., the self-aligned, via first process) as the barrier layer 104, the first seed layer 102, the conductive lines 401, and the first dielectric layer 503 described above with respect to FIGS. 1-5, respectively.

By using a via first process, as opposed to a via second process (in which the conductive lines would be formed and then covered and a via is then formed to contact the conductive lines), using the via first approach allows for a larger window to make contact between the second metallization layer 801 and the via 701. A larger grain size can also be achieved with a thicker metal film. Finally, there is no need for additional masks to exclude the via landing areas, which are normally used to avoid air-gaps which might cause a via-induced metal bridge (VIMB) to form.

In accordance with an embodiment, a semiconductor device comprising a conductive line over a substrate, wherein the conductive line extends a first distance from the substrate, is provided. A via is over the substrate, wherein a bottom surface of the via and a bottom surface of the conductive line are substantially planar, wherein the via comprises a first material that extends from the substrate a second distance larger than the first distance. A dielectric is over the conductive line and between the conductive line and the via, wherein the dielectric comprises a first material that extends throughout the dielectric.

In accordance with an embodiment, a semiconductor device comprising a via in physical contact with a substrate, wherein the via comprises a first material throughout the via, and a conductive line in physical contact with the substrate, wherein the conductive line has a thickness that is less than the via, is provided. A dielectric layer is covering the conductive line and adjacent to sidewalls of the via, wherein a first material of the dielectric layer extends from between the via and the conductive line and over the conductive line.

In accordance with an embodiment, a method of manufacturing a semiconductor device comprising placing a conductive material onto a substrate and patterning the conductive material into a via portion and a conductive line portion, wherein a first height of the via portion is larger than a second height of the conductive line portion, is provided. A dielectric is deposited over the via portion and the conductive line portion, and the dielectric and the via portion are planarized.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   placing a conductive material onto a substrate, wherein the conductive material comprises a first material throughout the conductive material;
   patterning the conductive material into a via portion and a conductive line portion, wherein a first height of the via portion is larger than a second height of the conductive line portion;
   depositing a dielectric liner over the via portion and the conductive line portion, wherein the depositing the dielectric liner is performed at least in part with a conformal deposition process;
   depositing a dielectric over the via portion and the conductive line portion; and
   simultaneously planarizing the dielectric and the via portion such that a top surface of the dielectric is substantially planar with a top surface of the via portion.

2. The method of claim 1, further comprising placing a barrier layer onto the substrate before the placing the conductive material.

3. The method of claim 2, wherein the barrier layer is formed using titanium, titanium nitride, tantalum, tantalum nitride, or combinations thereof.

4. The method of claim 1, wherein the placing the conductive material further comprises:
   depositing a seed layer over the substrate, wherein the substrate is substantially planar; and
   plating the seed layer to form the conductive material.

5. The method of claim 1, wherein the patterning the conductive material further comprises:
   depositing a first hard mask and a second hard mask onto the conductive material;
   patterning the first hard mask into a via hard mask;
   patterning the second hard mask into a conductive line hard mask; and
   patterning the conductive material with the via hard mask and the conductive line hard mask.

6. The method of claim 5, wherein the patterning the conductive material further comprises:
   forming openings in the conductive material, wherein bottoms of the openings are disposed between a first surface of the conductive material distal the substrate and a second surface of the conductive material opposing the first surface;
   removing the conductive line hard mask; and
   extending the openings through the conductive material after the removing the conductive line hard mask.

7. The method of claim 6, wherein the extending the openings exposes the substrate.

8. The method of claim 1, wherein the depositing the dielectric further comprises:
   depositing a first dielectric material;
   etching back the first dielectric material; and
   depositing an etch stop layer over the first dielectric material.

9. The method of claim 8, wherein the depositing the first dielectric material comprises depositing the first dielectric material such that an air gap is formed between the via portion and the conductive line portion.

10. The method of claim 8, wherein the etching back the first dielectric material comprises removing an upper portion of the first dielectric material such that an upper surface of the first dielectric material is closer to the substrate than an upper surface of the via portion.

11. The method of claim 1, wherein the dielectric liner physically contacts the via portion, the conductive line portion, and the substrate.

12. The method of claim ii, wherein the dielectric liner extends continuously from the via portion to the conductive line portion.

13. A method comprising:
    depositing a conductive layer over a substrate;
    patterning the conductive layer to form a via portion and a conductive line portion laterally spaced apart from the via portion, wherein the patterning reduces a thickness of the conductive layer in the conductive line portion while maintaining the thickness of the conductive layer in the via portion;
    conformally forming a dielectric liner over the via portion, the conductive line portion and the substrate;
    forming a dielectric layer over the dielectric liner; and
    planarizing the dielectric layer.

14. The method of claim 13, wherein a lower surface of the via portion is coplanar with a lower surface of the conductive line portion.

15. The method of claim 13, wherein the via portion has a first width at the upper surface of the via portion and a second width proximate the substrate, wherein the first width is smaller than the second width.

16. The method of claim 13, wherein the patterning forms an opening between the via portion and the conductive line portion, wherein the opening exposes the substrate.

17. The method of claim 16, wherein the dielectric liner contacts the via portion, the conductive line portion, and the substrate.

18. A method of forming interconnect structures comprising:
    forming a barrier layer over a substrate;
    forming a conductive material over the barrier layer;
    patterning the conductive material using mask layers, wherein the patterning removes top portions of the conductive material in a first region exposed by the mask layers, and the conductive material in a second region under the mask layers is shielded from the patterning, wherein remaining portions of the conductive material after the patterning form a via portion in the second region and a conductive line portion separated from the via portion in the first region, wherein after the patterning, the via portion has at least one of the mask layers disposed thereon, and the conductive line portion is free of the mask layers;
    forming a dielectric liner over the via portion, the at least one of the mask layers, the substrate, and the conductive line portion;
    forming a dielectric layer over the dielectric liner, the dielectric layer extending above a top surface of the via portion;
    recessing the dielectric layer such that a top surface of the dielectric layer after the recessing extends below the top surface of the via portion;
    forming an etch stop layer over the recessed dielectric layer, the etch stop layer extending above the top surface of the via portion; and
    planarizing the etch stop layer and the via portion.

19. The method of claim 18, wherein at least one of the conductive line portion and the via portion has a first width proximate the substrate, and a second width proximate a top surface thereof distal the substrate, wherein the first width is larger than the second width.

20. The method of claim 18, wherein the forming the dielectric liner comprises conformally forming the dielectric liner over the via portion, the at least one of the mask layers, the substrate, and the conductive line portion.

* * * * *